United States Patent
Hayashi et al.

(10) Patent No.: US 9,553,003 B2
(45) Date of Patent: Jan. 24, 2017

(54) SUBSTRATE PROCESSING DEVICE AND SUBSTRATE PROCESSING METHOD

(71) Applicant: SHIBAURA MECHATRONICS CORPORATION, Yokohama-shi, Kanagawa (JP)

(72) Inventors: Konosuke Hayashi, Yokohama (JP); Masaaki Furuya, Yokohama (JP); Takashi Ootagaki, Yokohama (JP); Yuji Nagashima, Yokohama (JP); Atsushi Kinase, Yokohama (JP); Masahiro Abe, Yokohama (JP)

(73) Assignee: SHIBAURA MECHATRONICS CORPORATION, Yokohama-shi (JP)

( * ) Notice: Subject to any disclaimer, the term of this patent is extended or adjusted under 35 U.S.C. 154(b) by 15 days.

(21) Appl. No.: 14/212,382

(22) Filed: Mar. 14, 2014

(65) Prior Publication Data

US 2014/0261554 A1    Sep. 18, 2014

(30) Foreign Application Priority Data

Mar. 18, 2013  (JP) .................................. 2013-054574
Sep. 30, 2013  (JP) .................................. 2013-205080
Feb. 21, 2014  (JP) .................................. 2014-031405

(51) Int. Cl.
  *H01L 21/67*    (2006.01)
  *H01L 21/02*    (2006.01)

(52) U.S. Cl.
  CPC ..... *H01L 21/6704* (2013.01); *H01L 21/67028* (2013.01); *H01L 21/67034* (2013.01); *H01L 21/67115* (2013.01)

(58) Field of Classification Search
  CPC ................... H01L 21/67051; H01L 21/67028; H01L 21/67034; H01L 21/67161; H01L 21/76864; H01L 21/02041–21/02093
  (Continued)

(56) References Cited

U.S. PATENT DOCUMENTS 6,033,135 A * 3/2000 An ............................ G03F 7/30
                                                                118/52
6,173,468 B1 * 1/2001 Yonemizu ............... B08B 1/007
                                                                15/102

(Continued)

FOREIGN PATENT DOCUMENTS

CN        1194454 A        9/1998
CN      102810498 A      12/2012

(Continued)

OTHER PUBLICATIONS

English Machine Translation of Description of JP2004259734 (Akira, Sep. 2004).*

(Continued)

*Primary Examiner* — Joseph L Perrin
*Assistant Examiner* — Irina Graf
(74) *Attorney, Agent, or Firm* — Birch, Stewart, Kolasch & Birch, LLP (57) ABSTRACT

In a substrate processing device 10 having a heating and drying unit 103 for drying a surface of a substrate W, the heating and drying unit 103 heats upward a vertically downward surface of the substrate W to dry the surface of the substrate by dropping and removing, by gravity, the droplets of the volatile solvent formed on the surface of the substrate W by the heating operation.

9 Claims, 6 Drawing Sheets

(58) Field of Classification Search
USPC .................................................... 134/95.2
See application file for complete search history.

(56) References Cited

U.S. PATENT DOCUMENTS

| | | | |
|---|---|---|---|
| 6,271,149 B1 | 8/2001 | Kondo et al. | |
| 7,000,621 B1 | 2/2006 | Verhaverbeke | |
| 8,097,091 B2 | 1/2012 | Rastegar et al. | |
| 2002/0017315 A1 | 2/2002 | Kamikawa et al. | |
| 2004/0014298 A1 | 1/2004 | Ehrke et al. | |
| 2006/0228897 A1 | 10/2006 | Timans | |
| 2006/0231125 A1 | 10/2006 | Yi | |
| 2007/0295365 A1 | 12/2007 | Miya et al. | |
| 2009/0139977 A1* | 6/2009 | Falter ................ | H01L 21/67115 219/405 |
| 2011/0155177 A1 | 6/2011 | Tamura et al. | |
| 2012/0132230 A1 | 5/2012 | Toshima et al. | |
| 2012/0160274 A1 | 6/2012 | Kasai et al. | |
| 2012/0260517 A1 | 10/2012 | Lenz et al. | |
| 2012/0304485 A1 | 12/2012 | Hayashi et al. | |
| 2012/0304921 A1 | 12/2012 | Miyamoto et al. | |
| 2013/0025155 A1 | 1/2013 | Kim et al. | |
| 2014/0144464 A1* | 5/2014 | Kaneko ............ | H01L 21/67046 134/4 |

FOREIGN PATENT DOCUMENTS

| | | |
|---|---|---|
| JP | 62-92325 A | 4/1987 |
| JP | 9-148297 A | 6/1997 |
| JP | 11-340187 A | 12/1999 |
| JP | 11-354487 A | 12/1999 |
| JP | 2003-229404 A | 8/2003 |
| JP | 2004259734 A * | 9/2004 |
| JP | 2008-34779 A | 2/2008 |
| JP | 2008-128567 A | 6/2008 |
| JP | 2009-76856 A | 4/2009 |
| KR | 10-2006-0108429 A | 10/2006 |
| KR | 10-2011-0028532 A | 3/2011 |
| KR | 10-2012-0074198 A | 7/2012 |
| TW | 200735164 | 9/2007 |
| TW | 201308476 A1 | 2/2013 |
| TW | 201308499 A1 | 2/2013 |

OTHER PUBLICATIONS

Extended European Search Report, dated Sep. 18, 2014, for European Application No. 14160175.7.
Extended European Search Report dated Sep. 29, 2014, issued in European Application No. 14160176.5.
Non-Final Office Action of related U.S. Appl. No. 14/212,218 issued on Sep. 10, 2015.
Non-Final Office Action of related U.S. Appl. No. 14/212,899 issued on Sep. 29, 2015.
Final Office Action of related U.S. Appl. No. 14/212,218, dated Feb. 11, 2016.
Machine translation of JP-2008-128567-A, published on Jun. 5, 2008.
English Machine Translation of JP-9-148297-A, published on Jun. 6, 1997.
Non-Final Office Action of related U.S. Appl. No. 14/212,218 issued on Aug. 2, 2016.
Non-Final Office Action of related U.S. Appl. No. 14/212,899 issued on Aug. 8, 2016.

* cited by examiner

SUBSTRATE PROCESSING DEVICE AND SUBSTRATE PROCESSING METHOD

The disclosure of Japanese Patent Application No. 2013-054574 filed Mar. 18, 2013. Japanese Patent Application No. 2013-205080 filed Sep. 30, 2013 and Japanese Patent Application No. 2014-031405 filed Feb. 21, 2014 including specifications, drawings and claims is incorporated herein by reference in its entirety, claiming the benefit of their priorities.

FIELD OF THE INVENTION

The present intention relates to a substrate processing device and a substrate processing method.

RELATED ART

In manufacturing semiconductors and others, a substrate processing device supplies a processing liquid to a surface of a substrate of a wafer, a liquid crystal substrate or the like to process a surface of the substrate, then supplies a cleaning liquid such as ultrapure water to the substrate surface to clean the substrate surface, and further dries it. In the drying, there are problems that occur with patterns, e.g. around memory cells and gates, collapsing due to miniaturization according to increase in integration degree and capacity of the semiconductors in recent years. This is due to spacing between patterns, structures of them, a surface tension of the cleaning liquid and others.

Accordingly, for the purpose of suppressing the pattern collapsing, such substrate drying method has been proposed (e.g., see Japanese Patent Application Publication No. 2008-34779 (Patent Literature 1)) that uses IPA (2-Propanol: Isopropyl Alcohol) having a smaller surface tension than the ultrapure water, and mass production factories and others have employed a method of drying the substrate by replacing the ultrapure water on the substrate surface with the IPA.
[Patent Literature 1] Japanese Patent Application Publication No. 2008-34779

SUMMARY OF THE INVENTION

Problems to be Solved by the Invention

However, the semiconductors have been increasingly miniaturized, and even the drying that uses a liquid such as organic solvent (e.g., IPA) or the like of a small surface tension may collapse fine patterns of wafers due to the surface tension and the like of the liquid.

Figure 5A:
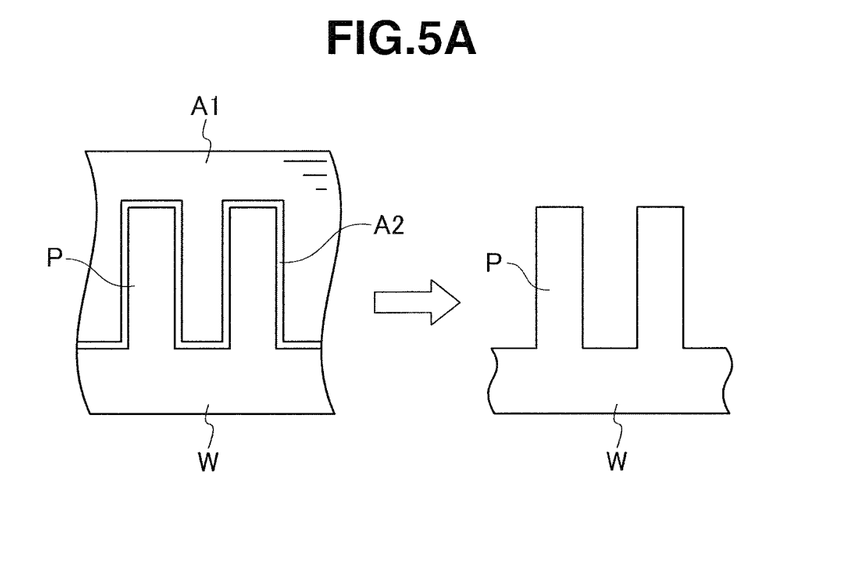
FIGS. 5A and 5B are schematic views illustrating a state of drying of a volatile solvent on a substrate surface.
Figure 5B:
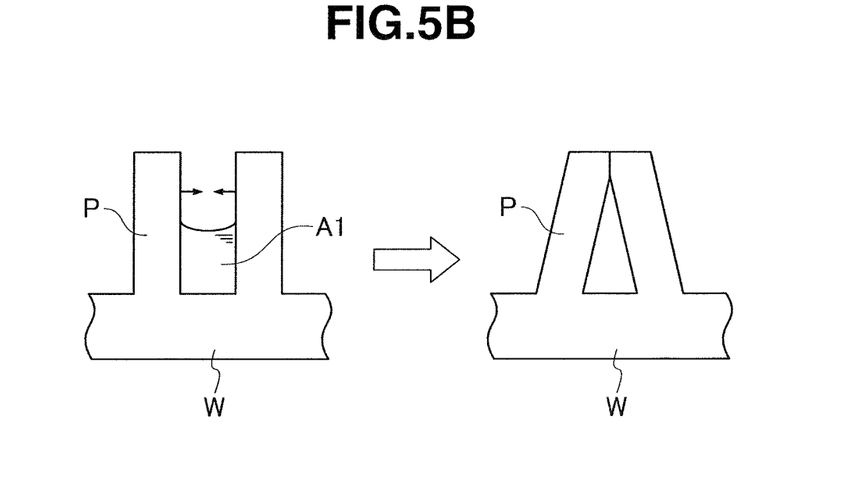

For example, during a liquid drying process, unequal speeds of drying are caused in various portions of a surface of a substrate W and, as illustrated in FIG. 5B, when a liquid A1 remains between some patterns P a pattern collapse is caused by the surface tension of the liquid A1 between them. In particular, the patterns located in the portion where the liquid remains are mutually pulled by the surface tension of the liquid, and elastically deform to collapse, and a slight amount of residues dissolved into the liquid condenses. When the liquid is completely dried thereafter, the collapsed patterns are fixedly adhered together due to interposition or the like of the residues.

An object of the invention is to provide a substrate processing device and a substrate processing method that can instantaneously dry a liquid on a surface during drying of a substrate.

Means for Solving the Problems

The invention provides a substrate processing device having a substrate cleaning chamber and a substrate drying chamber. The substrate cleaning chamber includes a cleaning liquid supply unit supplying a cleaning liquid to a surface of a substrate, and a solvent supply unit supplying a volatile solvent to the surface of the substrate supplied with the cleaning liquid to replace the cleaning liquid on the surface of the substrate with the volatile solvent. The substrate drying chamber includes a heating and drying unit heating the surface of the substrate supplied with the volatile solvent in the substrate cleaning chamber, removing a droplet of the volatile solvent formed on the surface of the substrate by a heating operation, and drying the surface of the substrate. The heating and drying unit heats upward a vertically downward surface of the substrate to dry the surface of the substrate by dropping and removing, by gravity, the droplet of the volatile solvent formed on the surface of the substrate by the heating operation.

The invention provides a substrate processing method using a substrate cleaning chamber and a substrate drying chamber. In the substrate cleaning chamber, the method performs supplying a cleaning liquid to a surface of a substrate, and supplying a volatile solvent to the surface of the substrate supplied with the cleaning liquid to replace the cleaning liquid on the surface of the substrate with the volatile solvent. In the substrate drying chamber, the method performs heating the surface of the substrate supplied with the volatile solvent in the substrate cleaning chamber, removing a droplet of the volatile solvent formed on the surface of the substrate by a heating operation, and drying the surface of the substrate. Heating and drying the surface of the substrate heats, by a heating and drying unit, upward a vertically downward surface of the substrate to dry the surface of the substrate by dropping and removing, by gravity, the droplets of the volatile solvent formed on the surface of the substrate by the heating operation.

Effect of the Invention

The substrate processing device and the substrate processing method of the invention can instantaneously dry the liquid on the surface of the substrate at the time of drying the substrate.

DETAILED DESCRIPTION

Figure 1:
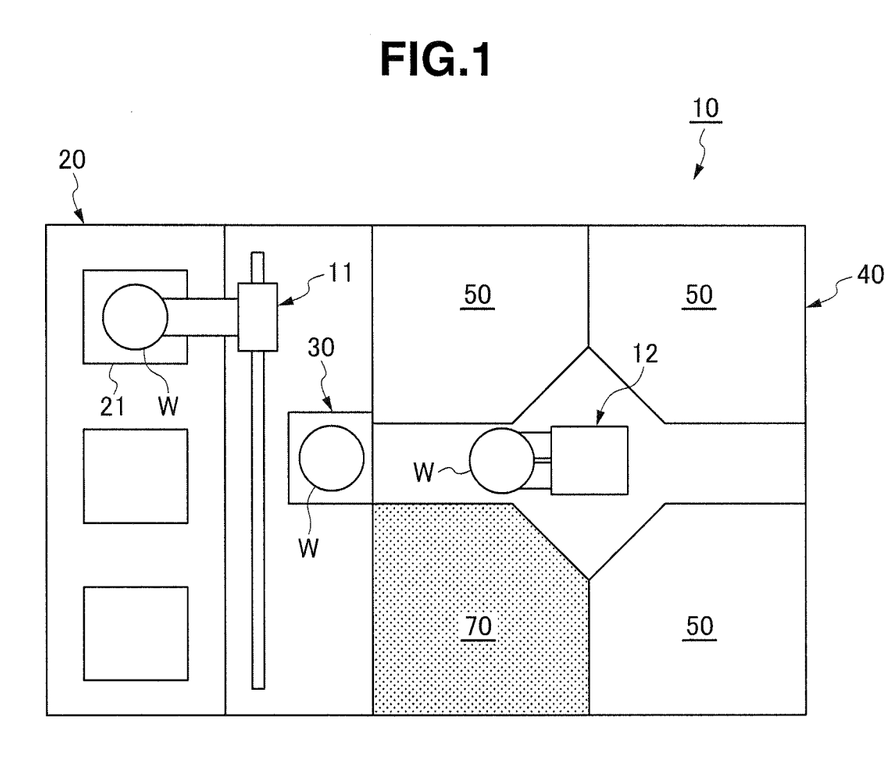
FIG. 1 is a schematic view illustrating a substrate processing device.

As illustrated in FIG. 1, a substrate processing device 10 has a substrate supply/discharge unit 20, a substrate storing buffer unit 30, and a plurality of substrate processing chambers 40. A transportation robot 11 is arranged between the substrate supply/discharge unit 20 and the substrate storing buffer unit 30, and a transportation robot 12 is arranged between the substrate storing buffer unit 30 and the substrate processing chamber 40. The substrate processing chamber 40 is formed of a substrate cleaning chamber 50 and a substrate drying chamber 70, as will be described later.

In the following description, the substrate drying chamber 70 (a heating unit 76 and a suction drying unit 77) is a reference example with respect to the invention, and a substrate drying chamber 100 (a heating and drying unit 103) is an example of the invention.

A plurality of substrate accommodation cassettes 21 can be supplied to and discharged from the substrate supply/discharge unit 20. The substrate accommodation cassette 21 that has accommodated a plurality of substrates W such as unprocessed wafers, liquid crystal substrates or the like is supplied to the substrate supply/discharge unit 20. Also, the substrate accommodation cassette 21 is discharged from the substrate supply/discharge unit 20 together with the accommodated substrates W that are processed in the substrate processing chamber 40. The unprocessed substrates W are successively taken out by the transportation robot 11 from multi-level accommodation shelves of the substrate accommodation cassette 21 in the substrate supply/discharge unit 20, and are supplied to an in-dedicated buffer 31 to be described later in the substrate storing buffer unit 30. The unprocessed substrates W supplied to the in-dedicated buffer 31 are taken out by the transportation robot 12, and are supplied to the substrate cleaning chamber 50 of the substrate processing chamber 40 for cleaning. The transportation robot 12 transfers the substrate W cleaned in the substrate cleaning chamber 50 from the substrate cleaning chamber 50 to the substrate drying chamber 70 for drying. The substrate W thus processed is taken out by the transportation robot 12 from the substrate drying chamber 70, and is sent into an out-dedicated buffer 32 (to be described later) of the substrate storing buffer unit 30 for temporal storage. The transportation robot 11 takes out the substrates W temporarily stored in the out-dedicated buffer 32 of the substrate storing buffer unit 30, and successively discharges them to the empty accommodation shelves of the substrate accommodation cassette 21 in the substrate supply/discharge unit 20. The substrate accommodation cassette 21 filled with the processed substrates W will be transported from the substrate supply/discharge unit 20.

Figure 4:
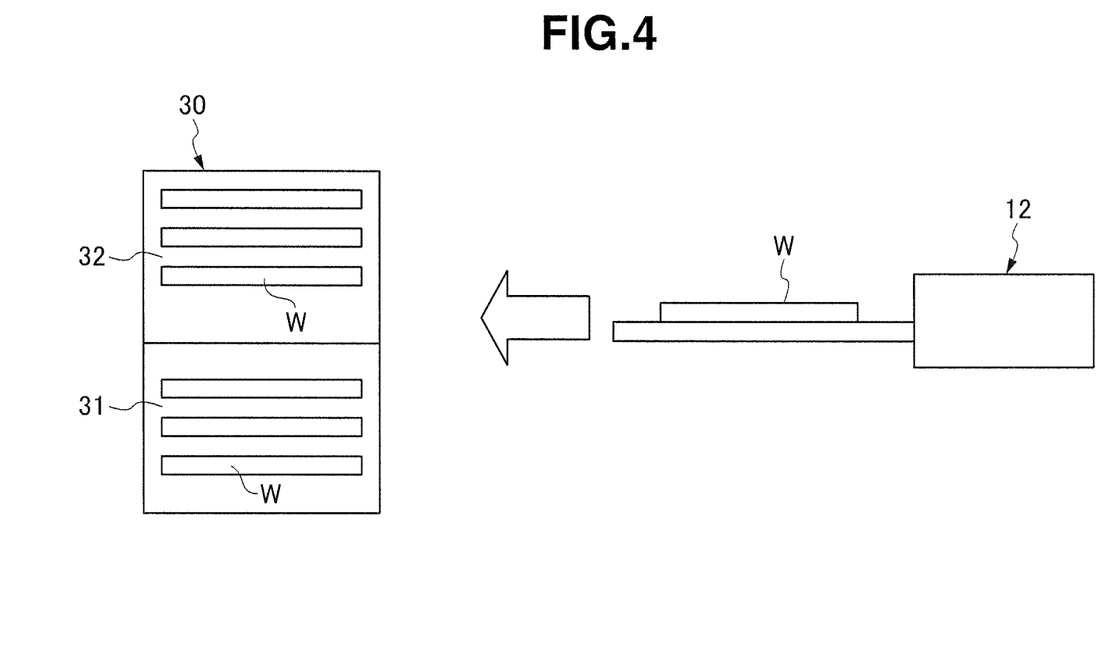
FIG. 4 is a schematic view illustrating a structure of a transporting unit of the substrate processing device.

As illustrated in FIG. 4, the substrate storing buffer unit 30 has the plurality of in-dedicated buffers 31 arranged in the multi-shelf form for storing the unprocessed substrates W, and has the plurality of out-dedicated buffers 32 arranged in the multi-shelf form for storing the substrates W cleaned and dried in the substrate processing chamber 40. A cooling unit for cooling the temporarily stored substrates W may be arranged in the out-dedicated buffer 32. The in-dedicated buffer 31 and the out-dedicated buffer 32 may not have the multi-shelf form.

In the substrate processing chamber 40, sets of the substrate cleaning chambers 50 and the substrate drying chambers 70 are arranged around (or on the opposite sides) of the transportation robot 12 located in a moving end position near the substrate processing chamber 40 spaced from the substrate storing buffer unit 30, and the substrate W cleaned by the substrate cleaning chamber 50 in the set is transferred to the substrate drying chambers 70 in the same set, and is dried therein. In the substrate processing chamber 40, assuming that a drying operation time in the substrate drying chamber 70 is 1 when a cleaning operation time in the substrate cleaning chamber 50 is N, numbers i and j of the substrate cleaning chambers 50 and the substrate drying chamber 70 arranged in the device are set to satisfy a relationship of (i:j=N:1). Thereby, when all the sets of substrate cleaning chambers 50 and substrate drying chambers 70 in the substrate processing chamber 40 operate in parallel in the same time band, a production quantity of the cleaning of the following substrates W in the substrate cleaning chambers 50 can be substantially equal to a production quantity of the drying of the preceding substrates W already cleaned in the substrate cleaning chambers 50 in the substrate drying chambers 70.

In the substrate processing chamber 40 of the embodiment, when the substrate cleaning chamber(s) 50 and the substrate drying chamber(s) 70 forming the set are arranged in each of the plurality of (e.g., three) levels, and the cleaning operation time N in the substrate cleaning chamber 50 is 3 (N=3), the drying operation time in the substrate drying chamber 70 is 1. Therefore, the substrate cleaning chambers 50 of i=3 in number and the substrate drying chamber 70 of j=1 in number are arranged in each level.

The substrate cleaning chamber 50 and the substrate drying chamber 70 forming the substrate processing chamber 40 will be described below in detail.

Figure 2:
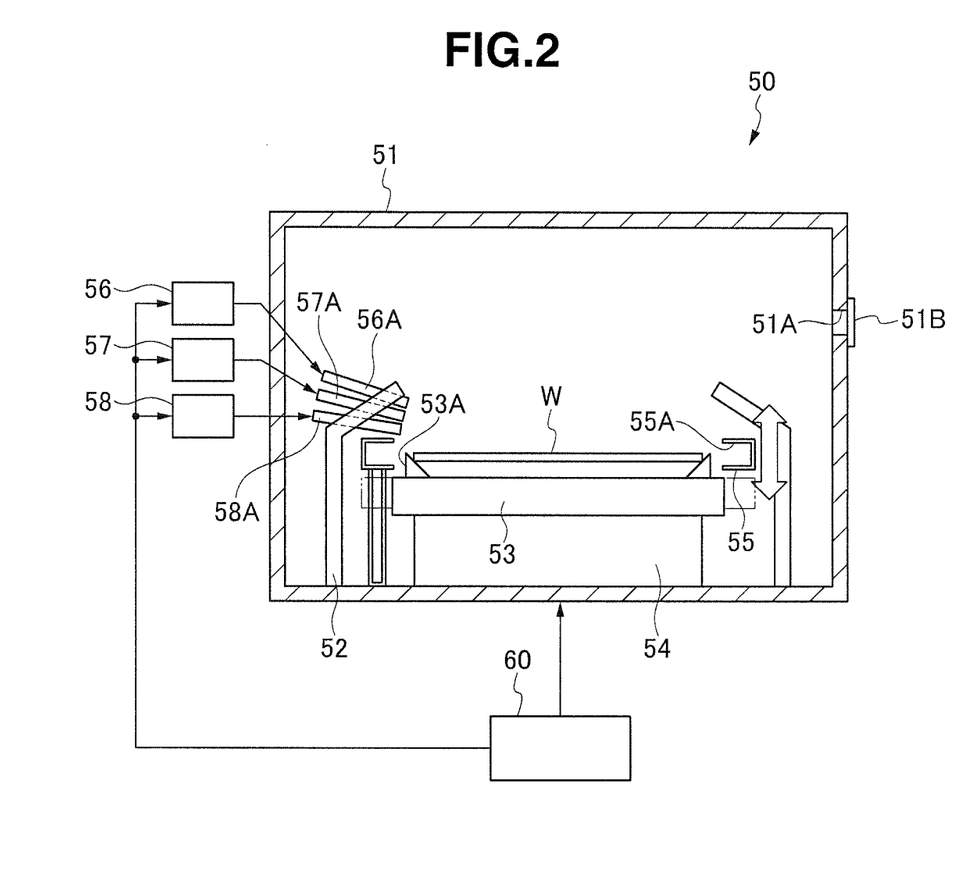
FIG. 2 is a schematic view illustrating a structure of a substrate cleaning chamber of the substrate processing device.

The substrate cleaning chamber 50 includes, as illustrated in FIG. 2, a processing box 51 forming a processing chamber, a cup 52 arranged in the processing box 51, a table 53 supporting the substrate W in a horizontal position in the cup 52, a rotation mechanism 54 rotating the table 53 in a horizontal plane, and a solvent suction discharging unit 55 that can vertically move around the table 53. Further, the substrate cleaning chamber 50 includes a chemical solution supply unit 56 supplying a chemical solution to the surface of the substrate W on the table 53, a cleaning liquid supply unit 57 supplying a cleaning liquid to the surface of the substrate W on the table 53, a solvent supply unit 58 supplying a volatile solvent, and a controller 60 controlling various units.

The processing box 51 has a substrate inlet/outlet opening 51A opening at a portion of its peripheral wall. A shutter 51B can close and open the substrate inlet/outlet opening 51A.

The cup 52 has a cylindrical form, surrounds the periphery of the table 53, and accommodates it. The cup 52 has a peripheral wall having an upper portion tapered to converge upward, and has an opening to expose the substrate W on the table 53 upward. This cup 52 receives the chemical solution and cleaning liquid that flow or disperse from the rotating substrate W. The cup 52 is provided at its bottom with a discharge pipe (not illustrated) for discharging the received chemical solution and cleaning liquid.

The table 53 is positioned near a center of the cup 52, and is rotatable in the horizontal plane. The table 53 has a plurality of support members 53A such as pins, which removably hold the substrate W such as a wafer or a liquid crystal substrate.

The rotation mechanism 54 has a rotation axis coupled to the table 53, a motor serving as a drive source for rotating the rotation shaft, and others (not illustrated), and rotates the table 53 by the driving of the motor through the rotation shaft. The rotation mechanism 54 is electrically connected to the controller 60, which controls the drive of the rotation mechanism 54.

The solvent suction discharging unit 55 includes a solvent absorbing port 55A having an annular opening surrounding the periphery of the table 53. The solvent suction discharging unit 55 has an elevator mechanism (not illustrated) for vertically moving the solvent absorbing port 55A, and vertically moves the solvent absorbing port 55A between a standby position where the solvent absorbing port 55A is positioned lower than the table surface of the table 53 and an operation position where the solvent absorbing port 55A is positioned around the substrate W held by the table 53. The solvent absorbing port 55A absorbs and receives the volatile solvent dispersed from the rotating substrate W. The solvent absorbing port 55A is connected to an exhaust fan or a vacuum pump (not illustrated) for absorbing the volatile solvent as well as an exhaust pipe (not illustrated) for discharging the volatile solvent that is absorbed and received.

The chemical solution supply unit 56 has a nozzle 56A discharging the chemical solution obliquely to the surface of the substrate W on the table 53, and supplies the chemical solution such as APM (Ammonia and hydrogen Peroxide Mixture) for resist peeling processing to the surface of the substrate W on the table 53 through the nozzle 56A. The nozzle 56A is attached to an upper portion of the peripheral wall of the cup 52, and its angle, discharging flow velocity and others are adjusted to supply the chemical solution to the vicinity of the surface center of the substrate W. The chemical solution supply unit 56 is electrically connected to the controller 60, which controls the drive of the chemical solution supply unit 56. The chemical solution supply unit 56 includes a tank storing the chemical solution, a pump serving as a drive source, a valve serving as a regulator valve regulating a supply rate, and others, although not illustrated.

The cleaning liquid supply unit 57 has a nozzle 57A discharging the cleaning liquid obliquely to the surface of the substrate W on the table 53, and supplies the cleaning liquid such as pure water (ultrapure water) for cleaning processing to the surface of the substrate W on the table 53 through the nozzle 57A. The nozzle 57A is attached to the upper portion of the peripheral wall of the cup 52, and its angle, discharging flow velocity and others are adjusted to supply the chemical solution to the vicinity of the surface center of the substrate W. The cleaning liquid supply unit 57 is electrically connected to the controller 60, which controls the drive of the cleaning liquid supply unit 57. The cleaning liquid supply unit 57 includes a tank storing the cleaning liquid, a pump serving as a drive source, and a valve serving as a regulator valve regulating a supply rate, although not illustrated.

The solvent supply unit 58 has a nozzle 58A discharging the volatile solvent obliquely to the surface of the substrate W on the table 53, and supplies the volatile solvent such as IPA to the surface of the substrate W on the table 53 through the nozzle 58A. The solvent supply unit 58 supplies the volatile solvent to the surface of the substrate W cleaned with the cleaning liquid supplied by the cleaning liquid supply unit 57, and replaces the cleaning liquid on the surface of the substrate W with the volatile solvent. The nozzle 58A is attached to the upper portion of the peripheral wall of the cup 52, and its angle, discharging flow velocity and others are adjusted to supply the volatile solvent to the vicinity of the surface center of the substrate W. The solvent supply unit 58 is electrically connected to the controller 60, which controls the drive of the solvent supply unit 58. The solvent supply unit 58 includes a tank storing the volatile solvent, a pump serving as a drive source, and a valve serving as a regulator valve regulating a supply rate, although not illustrated.

In addition to the IPA, univalent alcohols such as ethanol, and ethers such as diethyl ether and ethyl methyl ether as well as ethylene carbonate and the like may be used as the volatile solvent. The volatile solvent is preferably water-soluble.

The controller 60 includes a microcomputer that centrally controls the various portions, and a storage storing substrate processing information relating to the substrate processing, various kinds of programs and others. The controller 60 controls, based on the substrate processing information and various programs, the rotation mechanism 54, solvent suction discharging unit 55, chemical solution supply unit 56, cleaning liquid supply unit 57, solvent supply unit 58 and others, and controls the supplying of the chemical solution by the chemical solution supply unit 56, supplying of the cleaning liquid by the cleaning liquid supply unit 57, supplying of the volatile solvent by the solvent supply unit 58 performed on the surface of the substrate W on the rotating table 53, and others.

Figure 3:
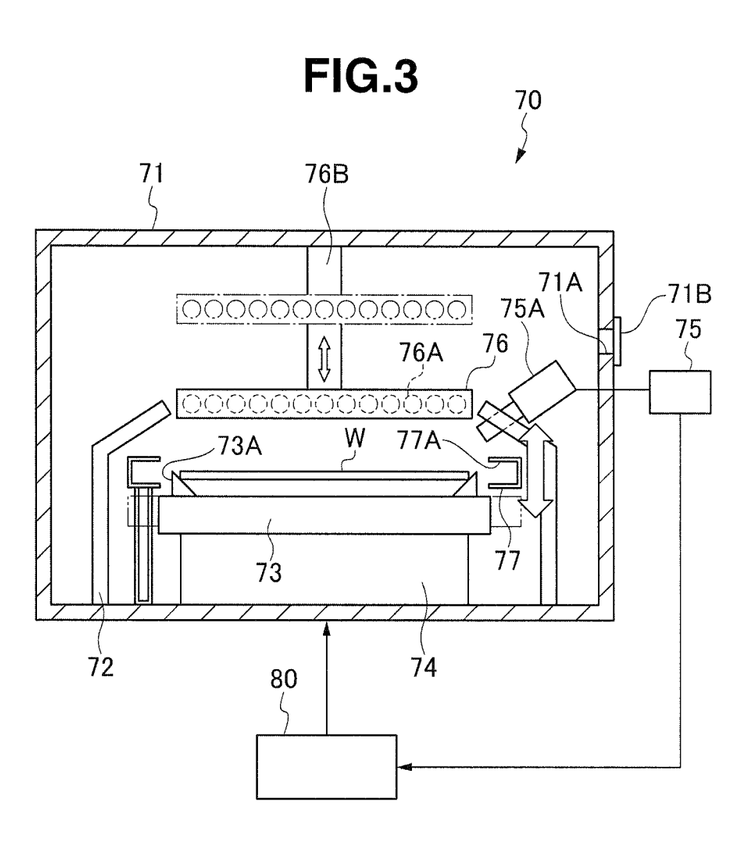
FIG. 3 is a schematic view illustrating a structure of a substrate drying chamber of the substrate processing device.

The substrate drying chamber 70 includes, as illustrated in FIG. 3, a processing box 71 serving as a processing chamber, a cup 72 arranged in the processing box 71, a table 73 carrying the substrate W in a horizontal position in the cup 72, a rotation mechanism 74 rotating the table 73 in a horizontal plane, a gas supply unit 75 supplying a gas, a heating unit 76 heating the surface of the substrate W supplied with the volatile solvent, a suction drying unit 77 for drying the surface of the substrate W heated by the heating unit 76, and a controller 80 controlling various units.

The processing box 71, cup 72, table 73, and rotation mechanism 74 are substantially the same as the processing box 51, cup 52, table 53, and rotation mechanism 54 in the substrate cleaning chamber 50, respectively. In FIG. 3, 71A, 71B, and 73A indicate a substrate inlet/outlet opening, a shutter, and a support member such as a pin, respectively.

The gas supply unit 75 has a nozzle 75A discharging a gas obliquely to the surface the substrate W on the table 73. The nozzle 75A supplies a gas such as a nitrogen gas to the surface of the substrate W on the table 73 to form a nitrogen gas atmosphere in the space on the surface of the substrate W in the processing box 71. The nozzle 75A is attached to an upper portion of the peripheral wall of the cup 72, and its angle, discharging flow velocity and others are adjusted to supply the gas to the vicinity of the surface center of the substrate W. This gas supply unit 75 is electrically connected to the controller 80, which controls the drive of the gas supply unit 75. The gas supply unit 75 includes a tank storing the gas, a valve serving as a regulator valve regulating a supply rate, and others, although not illustrated.

As the supplied gas, an inert gas such as argon gas, carbon dioxide gas or helium gas other than nitrogen gas can be used. Since the inert gas is supplied to the surface of the substrate W, the oxygen on the surface of the substrate W can be removed, and production of watermarks can be prevented. The supplied gas is preferably a heated gas.

The heating unit 76 has a plurality of lamps 76A, is arranged above the table 73, and irradiates the surface of the substrate W on the table 73 with light when each lamp 76A is turned on. This heating unit 76 is configured to be moved vertically (ascent/descent direction) by a moving unit 76B, and can move between an irradiation position close to the cup 72 (and close to the surface of the substrate W as indicated by solid line in FIG. 3) and a standby position spaced from the cup 72 by a predetermined distance (and spaced from the surface of the substrate W as indicated by alternate long and short dashed lines in FIG. 3). When the substrate W is to be set on the table 73 of the substrate drying chamber 70, the heating unit 76 may be positioned in a standby position so that impeding of the entry of the substrate W by the heating unit 76 can be avoided. The heating unit 76 may be lowered either after or before turning on the lamps. This heating unit 76 is electrically connected to the controller 80, which controls the drive of the heating unit 76.

The heating unit 76 may be formed of the plurality of lamps 76A. e.g. of a straight-tube type arranged in parallel, or the plurality of lamps 76A of a light ball type arranged in an array fashion. The lamp 76A may be, for example, a halogen lamp, xenon flash lamp or the like.

In heating of the substrate W using the heating unit 76, as illustrated in FIG. 5A, the heating by the heating unit 76 causes liquid A1 of the volatile solvent in contact with a pattern P on the surface of the substrate W to start evaporation earlier than the liquid A1 of the volatile solvent on the other portion. More specifically, in the liquid A1 of the volatile solvent supplied to the surface of the substrate W, only the portion in contact with the surface of the substrate W is rapidly heated to attain the gas phase. Thereby, gasification (boiling) of the liquid A1 of the volatile solvent forms a gas layer (collection of bubbles), namely a gas layer A2 of the volatile solvent taking a thin-film-like form around the pattern P on the surface of the substrate W. Therefore, the liquid A1 of the volatile solvent between the neighboring patterns P is pushed onto the surface of the substrate W by the gas layer A2, and its own surface tension changes the liquid A1 into many droplets.

The suction drying unit 77 is substantially the same as the solvent suction/discharge unit 55 already described in the substrate cleaning chamber 50, and is set, for functioning, in an operation position where a solvent absorbing port 77A opening in an annular form toward the periphery of the table 73 is positioned around the substrate W held by the table 73. The solvent absorbing port 55A absorbs and receives the volatile solvent dispersed from the rotating substrate W. This suction drying unit 77 is electrically connected to the controller 80, which controls the drive of the suction drying unit 77. The solvent absorbing port 77A is connected to a vacuum pump (not shown) for absorbing the droplets of the volatile solvent and a discharge pipe (not illustrated) for receiving and discharging the absorbed droplets of the volatile solvent.

The controller 80 includes a microcomputer centrally controlling various portions, and a storage storing the substrate processing information and various programs relating to the substrate processing. The controller 80 controls, based on the substrate processing information and various programs, the rotation mechanism 74, gas supply unit 75, heating unit 76, suction drying unit 77 and others, and controls the supplying of the gas by the gas supply unit 75 to the surface of the substrate W on the rotating table 73 as well as the heating by the heating unit 76, absorbing by the suction drying unit 77, and others.

Procedures of cleaning and drying the substrate W by the substrate processing device 10 will now be described below.

(1) The transportation robot 11 sends the substrate W from the substrate accommodation cassette 21 of the substrate supply/discharge unit 20 into the in-dedicated buffer 31 of the substrate storing buffer unit 30, and the transportation robot 12 takes out and sets the supplied substrate W on the table 53 of the substrate cleaning chamber 50 in the substrate processing chamber 40. In this state, the controller 60 of the substrate cleaning chamber 50 controls the rotation mechanism 54 to rotate the table 53 at a predetermined rotation speed, and then controls the chemical solution supply unit 56 while positioning the solvent suction discharging unit 55 in the standby position so that the chemical solution, i.e., APM is supplied from the nozzle 56A to the surface of the substrate W on the rotating table 53 for a predetermined time. The chemical solution, i.e. APM is discharged from the nozzle 56A toward the center of the substrate W on the rotating table 53, and the centrifugal force caused by the rotation of the substrate W spreads it over the whole surface of the substrate W. Thereby, the APM covers and processes the surface of the substrate W on the table 53.

The controller 60 continuously rotates the table 53 for a period from the above (1) to (3) to be described later. In this operation, the processing conditions such as a rotation speed of the table 53, a predetermined time and the like are set in advance, but an operator can arbitrarily change them.

(2) After stopping the supply of the chemical solution, the controller 60 then controls the cleaning liquid supply unit 57 to supply the cleaning liquid. i.e., ultrapure water from the nozzle 57A to the surface of the substrate W on the rotating table 53 for a predetermined time. The cleaning liquid, i.e., ultrapure water is discharged from the nozzle 57A toward the center of the substrate W on the rotating table 53, and is spread over the whole surface of the substrate W by the centrifugal force caused by rotation of the substrate W. Thereby, the surface of the substrate W on the table 53 is covered and cleaned by the ultrapure water.

(3) When the cleaning liquid supply unit 57 ends the cleaning of the substrate W, the controller 60 then locates the solvent suction discharging unit 55 in the operation position, and controls the solvent supply unit 58 to supply the volatile solvent, i.e., IPA from the nozzle 58A to the surface of the substrate W on the rotating table 53 for a predetermined time. The supply of the IPA is preferably performed before the ultrapure water is dried. The volatile solvent, i.e. IPA is discharged from the nozzle 58A toward the center of the substrate W on the rotating table 53, and is spread over the whole surface of the substrate W by the centrifugal force caused by rotation of the substrate W. At this time, the solvent suction discharging unit 55 absorbs the IPA dispersing from the rotating substrate W. Thereby, the ultrapure water on the surface of the substrate W on the table 53 is replaced with the IPA. The rotation speed of the substrate W, i.e. the table 53 in the above operation is substantially set to form a thin film of the volatile solvent over the surface of the substrate W to an extent that the surface of the substrate W is not exposed by forming.

The IPA discharged from the nozzle 58A of the solvent supply unit 58 is set to a temperature below a boiling point so that the IPA may reliably keep the liquid state when it is supplied to the surface of the substrate W, and thereby the ultrapure water may be reliably and uniformly replaced with the IPA throughout the surface of the substrate W. In this embodiment, the IPA in the liquid state is continuously supplied to the substrate W.

(4) Then, the controller 60 stops rotation of the table 53 of the substrate cleaning chamber 50, and the transportation robot 12 takes out the substrate W on the rotation-stopped table 53 from the substrate cleaning chamber 50, and sets the substrate W on the table 73 in the substrate drying chamber 70 of the substrate processing chamber 40. In this state, the controller 80 of the substrate drying chamber 70 controls the gas supply unit 75 to supply the gas, i.e., nitrogen gas from the nozzle 75A to the surface of the substrate W on the rotating table 73 for a predetermined time. The nozzle 75A discharges the nitrogen gas toward the whole area of the substrate W on the table 73. Thereby, the nitrogen atmosphere is formed in the space containing the substrate W on the table 73. By keeping the nitrogen atmosphere in this space, the oxygen concentration is reduced to suppress generation of watermarks on the surface of the substrate W.

The controller 80 continuously rotates the table 73 for a period from the above (4) to (6) to be described later. In this operation, the processing conditions such as a rotation speed of the table 73, a predetermined time and the like are set in advance, but an operator can arbitrarily change them.

(5) When the replacement with the IPA in the above (3) ends, the controller 80 controls the heating unit 76 to move the heating unit 76 from the standby position to an irradiation position, and turns on the lamps 76A of the heating unit 76 to heat the substrate W on the rotating table 73 for a predetermined time. At this time, the heating unit 76 can perform the heating that can raise the temperature of the substrate W to 100 degrees or above in 10 seconds. This can instantaneously vaporize the liquid A1 of the volatile solvent in contact with the pattern P on the surface of the substrate W, and can immediately form the droplets of the liquid A1 of the volatile solvent on the other portion of the surface of the substrate W.

In the above heat drying by the heating unit 76, it is important to heat the substrate W to a high temperature of hundreds of degrees within several seconds for instantaneously evaporating the volatile solvent, i.e. IPA in contact with the pattern P of the substrate W. It is necessary to heat only the substrate W without heating the IPA. For this, it is desirable to use the lamp 76A having a peak intensity in wavelengths of 500-3000 nm. For reliable drying, it is desirable that the final temperature of the substrate W attained by the heating is higher than the boiling points of the processing liquid and the solvent at an atmospheric pressure by 20° C. or more. Additionally, it is desirable that the time required for reaching the final temperature is substantially shorter than 10 seconds and, for example, falls within a range from several tens of milliseconds to several seconds.

(6) The droplets of the IPA formed on the surface of the substrate W by the heating operation of the heating unit 76 are dispersed radially outward by the centrifugal force caused by the rotation of the substrate W, and reach the suction drying unit 77. In this state, the solvent absorbing port 77A has a suction force so that the droplets of the IPA reaching the suction drying unit 77 are absorbed and removed through the solvent absorbing port 77A. Thereby, the drying ends. In this embodiment, therefore, the rotation table 73, the rotation mechanism 74, the suction drying unit 77 and others form the drying unit that removes the droplets of the volatile solvent formed on the surface of the substrate by the heating operation of the heating unit 76, and dries the surface of the substrate.

(7) Then, the controller 80 stops the rotation of the table 73, and the transportation robot 12 takes out the substrate W already dried on the rotation-stopped table 73 from the substrate drying chamber 70, and sends the substrate W into the out-dedicated buffer 32 of the substrate storing buffer unit 30.

Before taking out the substrate W in the above (7), the controller 80 turns off the lamps 76A of the heating unit 76, and positions it in the standby position. Thereby, the heating unit 76 does not impede the take-out operation of the substrate W.

(8) The transportation robot 11 takes out the substrate W from the out-dedicated buffer 32 of the substrate storing buffer unit 30, and discharges it to the substrate accommodation cassette 21 of the substrate supply/discharge unit 20.

Accordingly, in the substrate processing device 10, the substrate processing chamber 40 has the substrate cleaning chamber 50 and the substrate drying chamber 70, and has the transportation robot 12 arranged as the substrate transporting unit between the substrate cleaning chamber 50 and the substrate drying chamber 70. Thereby, in the substrate cleaning chamber 50, the device executes supplying the cleaning liquid to the surface of the substrate W, and supplying the volatile solvent to the surface of the substrate W supplied with the cleaning liquid to replace the cleaning liquid on the surface of the substrate W with the volatile solvent, and the transportation robot 12 transports the substrate W supplied with the volatile solvent in the substrate cleaning chamber 50 to the substrate drying chamber 70. In the substrate drying chamber 70, the device executes heating the substrate W supplied with the volatile solvent in the substrate cleaning chamber 50, and drying the surface of the substrate W by removing the droplets of the volatile solvent formed on the surface of the substrate W by the heating of the substrate W.

The embodiment achieves the following operation and effect.

(a) The operation of heating the substrate W by the heating unit 76 vaporizes the liquid of the volatile solvent, i.e., IPA used for replacement around the pattern P on the surface of the substrate W so that a gas layer of the vapored IPA forms a thin film around the pattern P on the surface of the substrate W. The liquid of IPA between the neighboring patterns P of the substrate W is pushed out by the gas layer, and is changed into a large number of droplets by its own surface tension. The droplets of the IPA formed on the surface of the substrate W in this manner are dispersed radially outward by the centrifugal force caused by the rotation of the substrate W, and are immediately absorbed and removed by the suction drying unit 77. Accordingly, the liquid of IPA can be dried instantaneously on the whole surface of the substrate W, and the drying speeds of various portions of the surface of the substrate W can be uniform so that remaining of the IPA between certain patterns P does not occur, and it is possible to suppress collapsing of the patterns P due to the surface tension of the liquid of the remaining IPA.

(b) The substrate cleaning chamber 50 and the substrate drying chamber 70 are arranged separately from each other, and the supplying of cleaning liquid and replacing using the volatile solvent are performed in parallel with heating and drying.

The substrate cleaning chamber 50 does not require the heating unit such as a lamp, and the substrate drying chamber 70 does not require the cleaning liquid supply unit and the solvent supply unit. Therefore, for example, when the substrate processing device 10 has the plurality of substrate cleaning chambers 50, the facilities can be compact as compared with a device in which the substrate cleaning chamber 50 is integrally combined with the substrate drying chamber 70.

The supplying of the cleaning liquid and replacing using the volatile solvent in the substrate cleaning chamber 50 can be performed in parallel with heating and drying in the substrate drying chamber 70, and the productivity of the substrates W can be improved. Therefore, even when the substrates W increase in size, the mass productivity can be improved.

Figure 6:
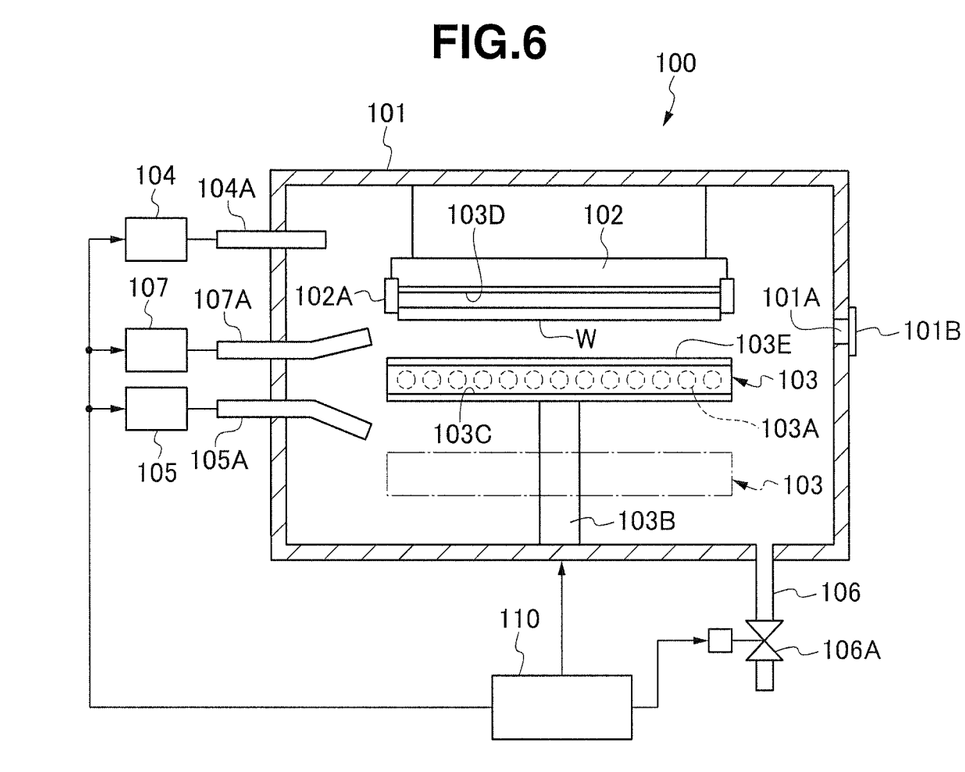
FIG. 6 is a schematic view illustrating a modification of the substrate drying chamber of the substrate processing device.

FIG. 6 illustrates an example of the invention in which the substrate drying chamber 70 in the substrate processing device 10 is replaced with a substrate drying chamber 100. The substrate drying chamber 100 differs from the substrate drying chamber 70 in that it heats upward a vertically downward surface of the substrate W, removes the droplets of the volatile solvent, which are formed on the surface of the substrate W by the heating operation, by dropping them by the gravity, and thereby dries the surface of the substrate W. The substrate cleaning chamber 50 in the example to be described below is the same as the substrate cleaning chamber 50 already described as the reference example.

The substrate drying chamber 100 includes, as illustrated in FIG. 6, a processing box 101 forming a processing chamber, a table 102 fixed to a ceiling surface of the processing box 101, a heating and drying unit 103 carried on a floor in the processing box 101, an atmosphere gas supply unit 104 supplying a gas into the processing box 101, a blow-off gas supply unit 105 supplying a gas to the heating and drying unit 103, and a controller 110 controlling various units. The heating and drying unit 103 heats the surface of the substrate W supplied with the volatile solvent, removes droplets of the volatile solvent formed on the surface of the substrate W by the heating operation, and dries the surface of the substrate W.

The processing box 101 has a substrate input/output opening 101A and a shutter 101B.

The table 102 has a chuck 102A for holding the substrate W and directs the surface of the substrate W vertically downward.

The heating and drying unit 103 has a plurality of lamps 103A, is arranged under the table 102, and irradiates the downward surface of the substrate W held on the table 102 with light when the lamps 103A are turned on. A moving mechanism 103B can move the heating and drying unit 103 vertically (in the rising and lowering direction) between an irradiation position (where it is close to the surface of the substrate W as indicated by solid line in FIG. 6) and a standby position (where it is spaced from the surface of the substrate W as indicated by alternate long and short dashed lines in FIG. 6). When the substrate W is to be set on the table 102 of the substrate drying chamber 100, the heating and drying unit 103 may be positioned in the standby position, so that impeding of the entry of the substrate W by the heating and drying unit 103 can be avoided. The heating and drying unit 103 may be raised either after or before turning on the lamps. This heating and drying unit 103 is electrically connected to the controller 110, which controls the drive of the heating and drying unit 103.

The heating and drying unit 103 may be formed of the plurality of lamps 103A, e.g., of a straight-tube type arranged in parallel, or the plurality of lamps 103A of a light ball type arranged in an array fashion. The lamp 103A may be, for example, a halogen lamp, xenon flash lamp or the like.

In the heating of the substrate W using the heating and drying unit 103, the heating by the heating and drying unit 103 causes the liquid of the volatile solvent in contact with the pattern P on the surface of the substrate W to start evaporation earlier than the liquid of the volatile solvent on the other portion. More specifically, in the liquid of the volatile solvent supplied to the surface of the substrate W, only the liquid in contact with the surface of the substrate W is rapidly heated to attain the gas phase. Thereby, gasification (boiling) of the liquid of the volatile solvent forms a gas layer (collection of bubbles) of the volatile solvent, i.e., a gas layer of the volatile solvent taking a thin film form around the pattern P on the surface of the substrate W. Therefore, the liquid of the volatile solvent between the neighboring patterns P is pushed onto the surface of the substrate W by the gas layer, and its own surface tension changes the liquid into many droplets. The gravity drops and removes the droplets of the volatile solvent formed on the downward surface of the substrate W by the heating operation of the heating and drying unit 103 so that the surface of the substrate W is dried.

The heating and drying unit 103 has reflectors 103C and 103D which are employed for improving the irradiation efficiency of the lamps 103A and are located at an upward surface located behind the lamp 103A and a downward surface of the table 102 located behind the substrate W held by the table 102, respectively. The heating and drying unit 103 is provided at an upper portion of the lamp 103A with a glass cover 103E for covering and protecting the lamp 103A. The protection cover may be a quartz plate transparent to infrared light.

The atmosphere gas supply unit 104 has a nozzle 104A for supplying an inert gas such as nitrogen gas into the processing box 101, and provides a nitrogen atmosphere in a space above the surface of the substrate W in the processing box 101. Thereby, the oxygen on the surface of the substrate W is removed to prevent generation of watermarks and to ensure explosion-proof with respect to the volatile solvent. The supplied gas is preferably a heated gas.

The blow-off gas supply unit 105 has a nozzle 105A for ejecting an inert gas such as nitrogen gas to the glass cover 103E of the heating and drying unit 103 lowered to the standby position, and removes the droplets of the volatile solvent which dropped from the surface of the substrate W as described before and reached the glass cover 103E by blowing off the them toward a floor of the processing box 101. On the floor of the processing box 101, there is arranged a discharge pipe 106 for absorbing and discharging the droplets of the volatile solvent that were removed by blowing. The discharge pipe 106 is provided with a valve 106A as a discharge valve. The discharge pipe 106 is connected to an exhaust fan or a vacuum pump (not illustrated).

The substrate drying chamber 100 may include a blow-off gas supply unit 107 blowing off the droplets formed on the substrate W from the substrate surface. The blow-off gas supply unit 107 has a nozzle 107A ejecting the inert gas such as nitrogen gas to the downward surface of the substrate W set on the table 102, and thereby it can blow off and remove the droplets of the volatile solvent formed on the downward surface of the substrate W by the heating operation of the heating and drying unit 103. The blow-off gas supply unit 107 starts supplying of the gas before or during the turn-on of the lamps 103A of the heating and drying unit 103, and stops the supply of the gas. e.g., after the turn-off of the lamps 103A.

The gas supplied from the nozzles 105A and 107A is preferably a heated gas.

The controller 110 includes a microcomputer that centrally controls the various portions, and a storage storing substrate processing information relating to the substrate processing, various kinds of programs and others. The controller 110 controls the heating and drying unit 103, atmosphere gas supply unit 104, blow-off gas supply units 105 and 107, valve 106A and others based on the substrate processing information and various programs.

Procedures of cleaning and drying the substrate W by the substrate drying chamber 100 in the substrate processing device 10 is described below.

(1) The transportation robot 12 takes out the substrate W cleaned in the substrate cleaning chamber 50 in the preceding step. The transportation robot 12 inverts the substrate W, inserts the substrate W directed vertically downward into the processing box 101, and sets it on the table 102. The controller 110 controls the atmosphere gas supply unit 104 to provide the nitrogen gas atmosphere in the processing box 101.

(2) The controller 110 controls the heating and drying unit 103 to locate it in the irradiation position, and turns on each lamp 103A of the heating and drying unit 103 to heat the downward surface of the substrate W for a predetermined time. At this time, the heating and drying unit 103 can perform the heating that can raise the temperature of the substrate W to or above 100 degrees in 10 seconds. This can instantaneously vaporize the liquid of the volatile solvent in contact with the pattern P on the surface of the substrate W, and can immediately form the droplets of the liquid of the volatile solvent on the other portion of the surface of the substrate W.

In the above heating and drying by the heating and drying unit 103, it is important to heat the substrate W to a high temperature of hundreds of degrees within several seconds for instantaneously evaporating the volatile solvent, i.e., IPA in contact with the pattern P of the substrate W. It is also necessary to heat only the substrate W without heating the IPA. For this, it is desirable to use the lamp 103A having a peak intensity in wavelengths of 500-3000 nm. For reliable drying, it is desirable that the final temperature of the substrate W attained by the heating is higher than the boiling points of the processing liquid and the solvent at an atmospheric pressure by 20° C. or more. Additionally, it is desirable that the time required for reaching the final temperature is substantially shorter than 10 seconds and, for example, falls within a range from several tens of milliseconds to several seconds.

(3) The gravity drops and removes the droplets of the IPA formed on the surface of the substrate W by the heating operation of the heating and drying unit 103 so that the surface of the substrate W is dried. The droplets of the IPA removed by dropping from the surface of the substrate W reach the glass cover 103E of the heating and drying unit 103, then are removed by blowing by the gas which is supplied from the blow-off gas supply unit 105 to the glass cover 103E of the heating and drying unit 103 lowered to the standby position, are absorbed by the discharge pipe 106 at the floor of the processing box 101, and are externally discharged.

The droplets of the IPA formed on the surface of the substrate W by the heating operation of the heating and drying unit 103 can be removed by blowing off them by the gas supplied from the blow-off gas supply unit 107. The droplets of the IPA that were blown by the gas and fell onto the floor of the processing box 101 are absorbed by the discharge pipe 106 on the floor, and are externally discharged.

(4) The transportation robot 12 takes out the substrate W dried on the table 102 from the processing box 101. The transportation robot 12 inverts the substrate W again, and supplies the substrate W in the vertically upward position into the out-dedicated buffer 32 of the substrate storing buffer unit 30. As described before, when the out-dedicated buffer internally has a cooling unit, the cooling unit forcedly cools the substrate W.

Before taking out the substrate W in the above (4), the controller 110 turns off the lamps 103A of the heating unit 103, and positions it in the standby position. Thereby, the heating unit 103 does not impede the take-out operation of the substrate W.

According to the embodiment, the heating and drying unit 103 heats upward the vertically downward surface of the substrate W to drop by gravity and remove the droplets of the IPA formed on the surface of the substrate W by the heating operation. Therefore, it is not necessary to rotate the substrate W for removing the droplets of the IPA. The liquid can be easily dried throughout the surface of the substrate W, and it is possible to suppress collapsing of the pattern P due to the surface tension of the liquid of the remaining IPA. However, by rotating the substrate, the droplets of the IPA formed on the surface of the substrate W may be removed by the centrifugal force caused by the rotation of the substrate as well as the operation of the gravity of the droplets.

Although the invention has been described in detail with reference to the drawings, the specific structure of the invention is not restricted to these embodiments, and the invention contains changes and variations of design within a scope not departing from the essence of the invention.

The embodiment has been described in connection with an example in which the supply of the volatile solvent such as IPA as well as the preceding liquid supply to the substrate are performed in the substrate cleaning chamber, the substrate supplied with the volatile solvent is transported to the substrate drying chamber, and the substrate is dried in the substrate drying chamber. However, such a manner may be employed that an operation following the cleaning with the cleaning liquid is not performed in the substrate cleaning chamber, and the substrate cleaned with the cleaning liquid is then transported to the substrate drying chamber. In the substrate drying chamber, processing is performed to replace the cleaning liquid with the volatile solvent such as IPA by supplying the IPA while, for example, rotating the substrate, and further, similarly to the foregoing, to perform the instantaneous heating of the substrate by the heating unit as well as the drying by removing the droplets of the volatile solvent such as IPA produced by the heating. This is advantageous in safety in view of such points that the processing from the supplying of the volatile IPA or the like to the substrate to the end of the drying can be executed in the same chamber, and that the time required from the supply of the IPA or the like to the substrate to the drying can be short, and other points. The substantially same structure as that of the nozzle 58A in FIG. 2 may be used for supplying the volatile solvent.

The operation of supplying the inert gas such as nitrogen gas by each of the gas supply unit 75 and the atmosphere gas supply unit 104 is configured to start after the substrate W is positioned in the supply position, but may start before such positioning.

In each embodiment, the heating of the substrate W by the heating unit 76 or heating and drying unit 103 may be performed in a state where the pressure in the processing box 71 or 101 is reduced. This lowers the boiling point of the volatile solvent such as IPA in the processing box 71 or 101, and causes boiling at a temperature lower than that in the atmospheric pressure so that the heat damage to the substrate can be reduced.

In each embodiment, the supply of the volatile solvent such as IPA to the substrate W starts after the supply of the cleaning liquid stopped. However, the supply of the volatile solvent may start while the supply of the cleaning water to the substrate W is still continuing in a final period of the cleaning with the cleaning liquid.

The inert gas atmosphere of nitrogen gas or the like may be formed in the processing box 51 prior to the supplying of the volatile solvent such as IPA to the substrate W.

INDUSTRIAL APPLICABILITY

The invention can provide the substrate processing device and the substrate processing method that instantaneously dry the liquid on the surface during drying of the substrate.

EXPLANATIONS OF LETTERS OF NUMERALS 10 substrate processing device
12 transportation robot (substrate transporting unit)
50 substrate cleaning chamber
57 cleaning liquid supply unit
58 solvent supply unit
100 substrate drying chamber
101 processing box
102 table
103 heating and drying unit
103A lamp
103C, 103D reflector
103E glass cover
105 blow-off gas supply unit
105A nozzle
W substrate

What is claimed is:

1. A substrate processing device having a substrate cleaning chamber, a transportation robot, and a substrate drying chamber, wherein
the substrate cleaning chamber includes a first table holding and rotating a substrate in a manner to direct a surface with a pattern of the substrate upward, a cleaning liquid supply unit supplying a cleaning liquid to the upwardly directed surface of the rotating substrate, and a solvent supply unit supplying a volatile solvent to the surface of the substrate supplied with the cleaning liquid to replace the cleaning liquid on the surface of the substrate with the volatile solvent,
the transportation robot is configured to take out the substrate processed in the substrate cleaning chamber from the substrate cleaning chamber, to invert the substrate to direct its surface with the pattern downward, and to supply the substrate to the substrate drying chamber,
the substrate drying chamber includes:
a second table holding the substrate which is supplied by the transportation robot so that the surface with the pattern of the substrate is directed downward,
a heating and drying unit provided below the second table, and having a lamp irradiating upward with light having a peak intensity in wavelengths between 500 nm and 3000 nm, and a protection cover located at an upper portion of the lamp for covering and protecting the lamp,
the heating and drying unit heating the surface of the substrate supplied with the volatile solvent in the substrate cleaning chamber, removing the volatile solvent from the surface of the substrate, and drying the surface of the substrate, and
a nozzle fixedly provided, between the downward-directed surface with the pattern of the substrate and the heating and drying unit, and, outside of the outer periphery of the heating and drying unit, so as to eject an inert gas to the protection cover from the outside of the protection cover.

2. The substrate processing device according to claim 1, wherein
the heating and drying unit is provided with a reflector for improving an irradiation efficiency of the lamp.

3. The substrate processing device according to claim 1, wherein
the nozzle is provided so as to penetrate a side wall of the substrate drying chamber.

4. The substrate processing device according to claim 3, wherein a top end of the nozzle is bent toward the protection cover.

5. The substrate processing device according to claim 1, wherein
the substrate drying chamber further having a second nozzle supplying an inert gas toward a space between the surface with the pattern of the substrate supported by the second table and a ceiling surface of the substrate drying chamber.

6. A substrate processing device having a substrate cleaning chamber, a transportation robot, and a substrate drying chamber, wherein
the substrate cleaning chamber includes a first table holding and rotating a substrate in a manner to direct a surface with a pattern of the substrate upward, a cleaning liquid supply unit supplying a cleaning liquid to the upwardly directed surface of the rotating substrate, and a solvent supply unit supplying a volatile solvent to the surface of the substrate supplied with the cleaning liquid to replace the cleaning liquid on the surface of the substrate with the volatile solvent,
the transportation robot is configured to take out the substrate processed in the substrate cleaning chamber from the substrate cleaning chamber, to invert the substrate to direct its surface with the pattern downward, and to supply the substrate to the substrate drying chamber,
the substrate drying chamber includes:
a second table holding the substrate which is supplied by the transportation robot so that the surface with the pattern of the substrate is directed downward,
a heating and drying unit provided below the second table, and having a lamp irradiating upward with light having a peak intensity in wavelengths between 500 nm and 3000 nm,
the heating and drying unit heating the surface with the pattern of the substrate which is supplied with the volatile solvent in the substrate cleaning chamber, removing the volatile solvent from the surface with the pattern of the substrate, and drying the surface with the pattern of the substrate, and
a first blow-off nozzle fixedly provided, between the downward-directed surface with the pattern of the substrate and the heating and drying unit, and outside of the outer periphery of the substrate, so as to eject a gas toward the surface with the pattern of the substrate from the outside of the substrate.

7. The substrate processing device according to claim 6, wherein the first blow-off nozzle is provided so as to penetrate a side wall of the substrate drying chamber.

8. The substrate processing device according to claim 7, wherein a top end of the first blow-off nozzle is bent toward the substrate.

9. The substrate processing device according to claim 6, wherein
the substrate drying chamber further having a second nozzle supplying an inert gas toward a space between the surface with the pattern of the substrate supported by the second table and a ceiling surface of the substrate drying chamber.

* * * * *